United States Patent
Bignon et al.

(10) Patent No.: US 8,815,340 B2
(45) Date of Patent: Aug. 26, 2014

(54) THIN FILM DEPOSITION METHOD

(75) Inventors: Guillaume Bignon, Paris (FR); Nicolas Nadaud, Paris (FR); Binh Tran, Buc (FR); Se-Jong Kim, Compiegne (FR)

(73) Assignee: Saint-Gobain Glass France, Courbevoie (FR)

( * ) Notice: Subject to any disclaimer, the term of this patent is extended or adjusted under 35 U.S.C. 154(b) by 281 days.

(21) Appl. No.: 13/148,826

(22) PCT Filed: Mar. 10, 2010

(86) PCT No.: PCT/FR2010/050409
§ 371 (c)(1),
(2), (4) Date: Aug. 10, 2011

(87) PCT Pub. No.: WO2010/103237
PCT Pub. Date: Sep. 16, 2010

(65) Prior Publication Data
US 2011/0311732 A1    Dec. 22, 2011

(30) Foreign Application Priority Data
Mar. 11, 2009  (FR) ...................... 09 51525

(51) Int. Cl.
*B05D 3/08*    (2006.01)

(52) U.S. Cl.
USPC ........................................................ 427/224

(58) Field of Classification Search
CPC   C03C 17/36; C03C 17/3618; C03C 17/3642; C03C 17/3668; C03C 17/366; C03C 17/245; C03C 23/007; C03C 2218/32; C03C 2217/78; B05D 3/08; C23C 2/28
USPC ........................................................ 427/224
See application file for complete search history.

(56) References Cited

U.S. PATENT DOCUMENTS 5,093,207 A * 3/1992 Hodes et al. .................. 428/614
2007/0111450 A1 * 5/2007 Sato et al. ..................... 438/264
2008/0008829 A1 * 1/2008 Blacker et al. ................ 427/162
2009/0011194 A1    1/2009 Nadaud et al.
2010/0071810 A1 * 3/2010 Nadaud et al. ................ 148/400

FOREIGN PATENT DOCUMENTS

| FR | 2 892 409 | 4/2007 |
| FR | 2 911 130 | 7/2008 |
| FR | 2911130 A1 * | 7/2008 |

OTHER PUBLICATIONS

International Search Report Issued Jul. 27, 2010 in PCT/FR10/050409 filed Mar. 10, 2010.
U.S. Appl. No. 13/496,090, filed Mar. 14, 2012, Kharchenko, et al.

* cited by examiner

*Primary Examiner* — Kelly M Gambetta
(74) *Attorney, Agent, or Firm* — Oblon, Spivak, McClelland, Maier & Neustadt, L.L.P.

(57) ABSTRACT

The subject of the invention is a heat treatment process by flame treatment of at least one thin film deposited on a glass substrate (1) running in the path of at least one flame treatment device comprising at least one burner (2), said treatment being able to increase the degree of crystallization of said at least one thin film and/or to increase the size of the crystallites in said at least one thin film, said process being characterized in that the maximum transient bending "b" is less than 150 mm and respects the following condition:

$$b \leq 0.9 \times d$$

where the bending "b" corresponds to the distance, expressed in mm, between the plane of the substrate without heating ($P_1$) and the point of the substrate closest to the plane ($P_2$) passing through the tip (6) of the burner (2) and parallel to the plane of the substrate without heating ($P_1$),
"d" corresponds to the distance between the plane of the substrate without heating ($P_1$) and the tip (6) of the burner (2), expressed in mm,
the width of the substrate "L" in a direction perpendicular to the run direction (5) being greater than or equal to 1.1 m.

20 Claims, 6 Drawing Sheets

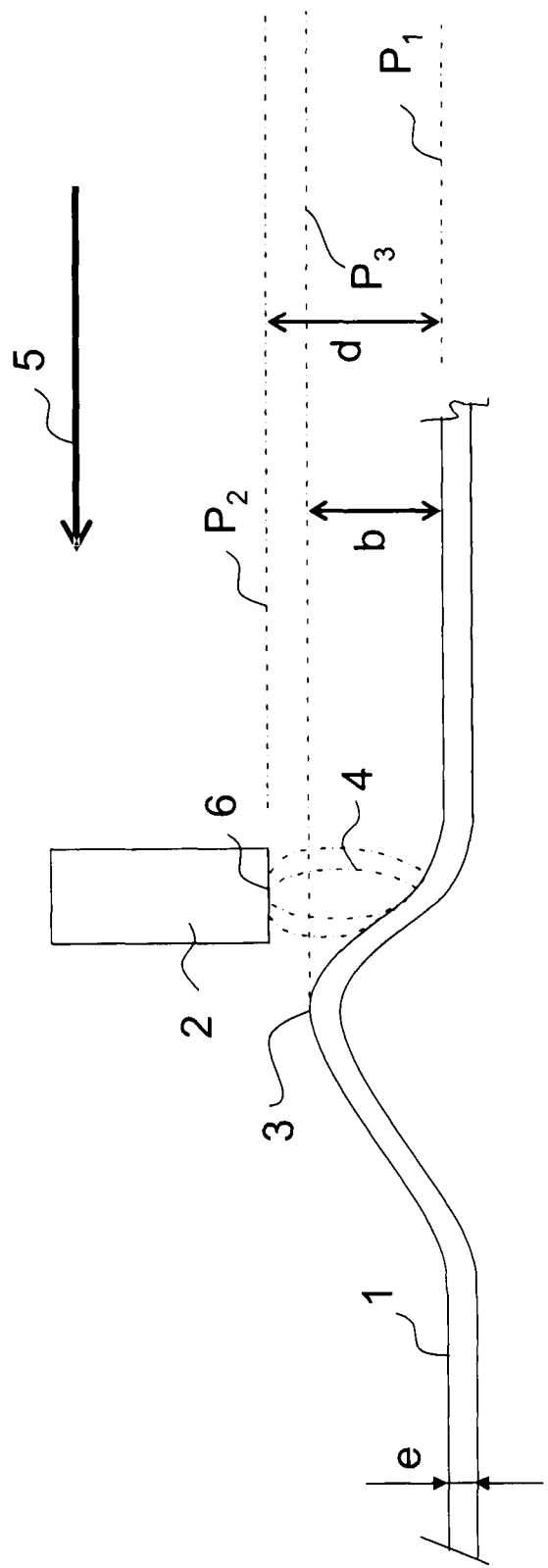

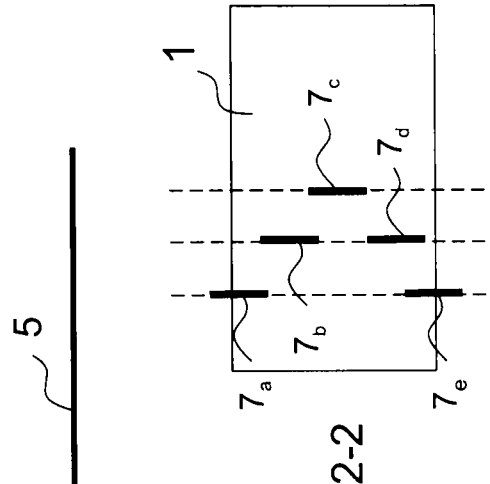
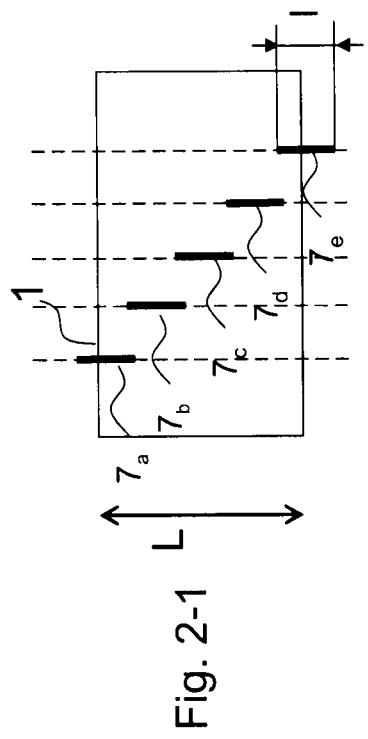
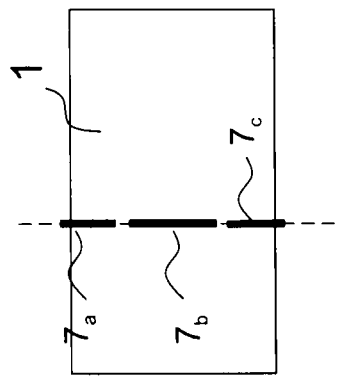
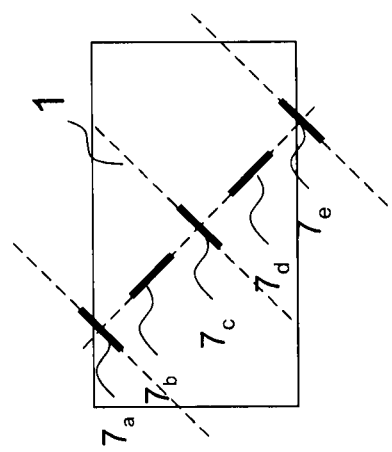

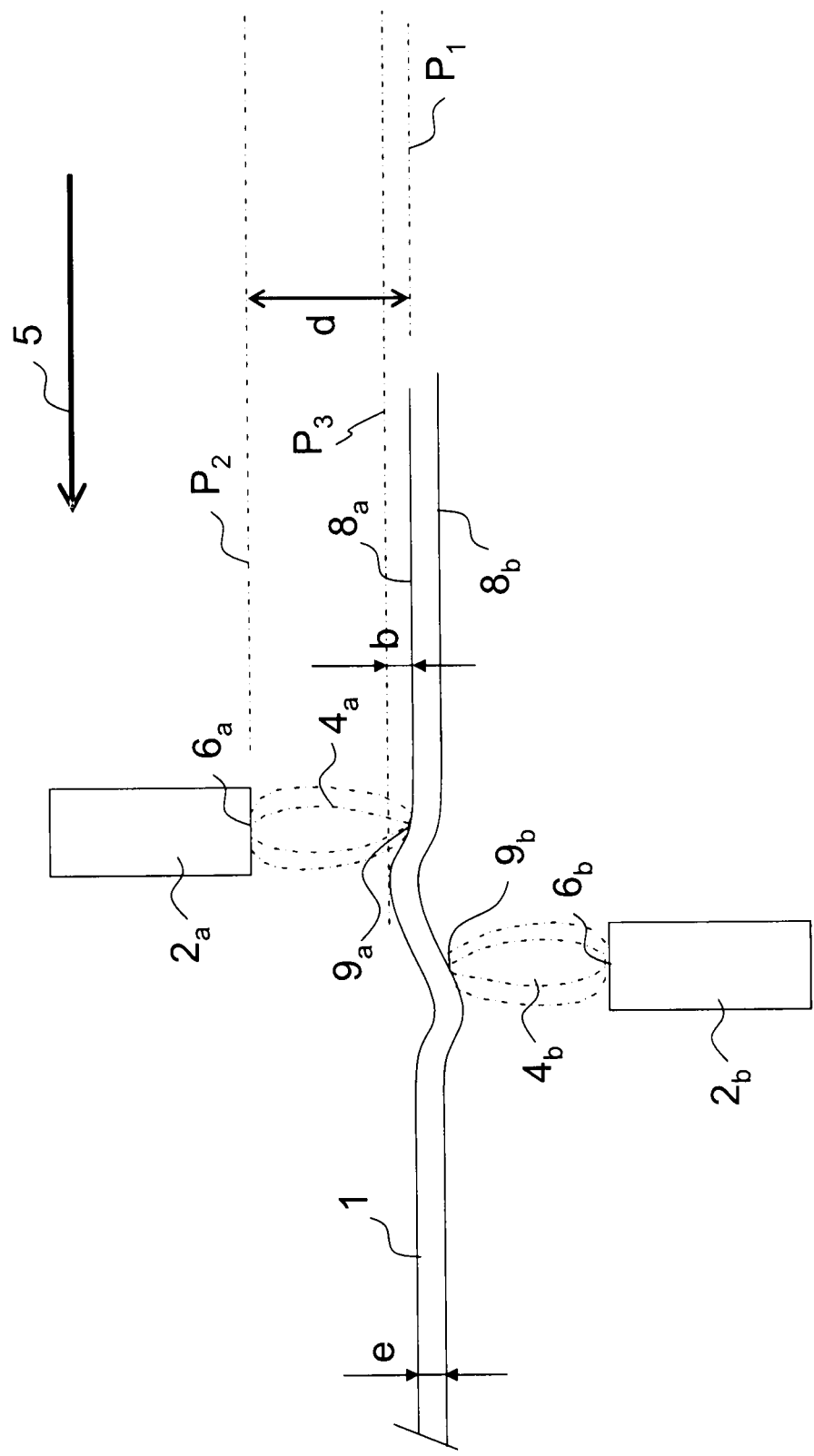

THIN FILM DEPOSITION METHOD

The invention relates to the field of thin inorganic films, especially those deposited on glass substrates. It relates more particularly to a process for at least partially crystallizing said thin films and to certain products obtained using this process.

Many thin films are deposited on substrates, especially those made of flat or slightly curved glass, so as to give the materials obtained particular properties, namely: optical properties, for example reflection or absorption properties for radiation with a given wavelength range; particular electrical conduction properties; or else properties associated with ease of cleaning or with the possibility of the material being self-cleaning.

These thin films are usually based on inorganic compounds, such as oxides or nitrides, or else on metals. Their thickness generally varies from a few nanometers to a few hundred nanometers, hence they are termed "thin".

To give examples, mention may be made of thin films based on indium tin mixed oxides (called ITO), based on indium zinc mixed oxides (called IZO), based on gallium-doped or aluminum-doped zinc oxide, based on niobium-doped titanium oxide, based on cadmium or zinc stannate, or based on fluorine-doped and/or antimony-doped tin oxide. These various films have the particular feature of being transparent, but nevertheless conductive or semi-conductive, films and are employed in many systems in which these two properties are necessary: liquid crystal displays (LCDs), solar or photovoltaic sensors, electrochromic or electroluminescent devices, etc.

Thin films based on metallic silver or metallic molybdenum or niobium may also be mentioned that have electrical conduction properties and properties for reflecting infrared radiation, hence their use in solar-control glazing, especially solar-protection glazing (with the aim of reducing the amount of incoming solar energy) or low-emissivity glazing (with the aim of reducing the amount of energy dissipated to the outside of a building or a vehicle).

Thin films based on titanium oxide may also be mentioned that have the particular feature of being self-cleaning, making it easier for organic compounds to be degraded under the action of ultraviolet radiation and for mineral contamination (dust) to be removed through the action of running water.

The various films mentioned have the common feature of seeing some of their properties improved when they are in an at least partially crystallized state. In general, the aim is to maximize the degree of crystallization (the proportion by weight or by volume of crystallized material) of these films and the size of the crystalline grains (or the size of the coherent diffraction domains measured by X-ray diffraction methods), or in certain cases to promote a particular crystallographic form.

In the case of titanium oxide, it is known that titanium oxide crystallized in the anatase form is much more effective in terms of organic compound degradation than amorphous titanium oxide or titanium oxide crystallized in the rutile or brookite form.

It is also known that silver films having a high degree of crystallization, and consequently a low residual content of amorphous silver, have a lower emissivity and a lower resistivity than predominantly amorphous silver films. The same applies when the size of the crystallographically coherent crystalline domains increases. The electrical conductivity and the low-emissivity properties of these films are thus improved.

Likewise, the aforementioned transparent conductive films, especially those based on doped zinc oxide or tin-doped indium oxide films, have a higher electrical conductivity the higher their degree of crystallization.

One process commonly employed on an industrial scale for the deposition of thin films, especially on a glass substrate, is the magnetically enhanced sputtering process, called magnetron sputtering. In this process, a plasma is created in a high vacuum close to a target comprising the chemical elements to be deposited. The active species of the plasma, which bombard the target, tear off said elements, which are deposited on the substrate, thus forming the desired thin film. This process is said to be "reactive" when the film consists of a material resulting from a chemical reaction between the elements torn off the target and the gas contained in the plasma. Thus, it is known to deposit titanium oxide films by the reactive magnetron sputtering process, employing a metallic titanium target and an oxygen-based plasma gas. The major advantage of this process lies in the possibility of depositing a very complex multilayer coating on the same line, by making the substrate run in succession beneath various targets, this generally being carried out in one and the same device.

When implementing the magnetron sputtering process on an industrial scale, the substrate remains at ambient temperature or is raised to a moderate temperature (below 80° C.), particularly when the run speed of the substrate is high (which is generally desirable for economic reasons). What may seem to be an advantage constitutes however a drawback in the case of the aforementioned films, since the low temperatures involved do not in general allow sufficient crystalline growth. This is most particularly the case for thin films of small thickness and/or films made of materials having a very high melting point. The films obtained according to this process are therefore predominantly, or even completely, amorphous or nanocrystalline (the average size of the crystalline grains being less than a few nanometers), and heat treatments prove to be necessary in order to obtain the desired degree of crystallization or the desired grain size.

Possible heat treatments consist in reheating the substrate either during deposition or after deposition, upon leaving the magnetron line. Most generally, temperatures of at least 300° C. or 400° C. are necessary. Indeed, the crystallization is better and the grain size larger the closer the temperature of the substrate is to the melting point of the material constituting the thin film.

In industrial magnetron lines, heating of the substrate (during deposition) proves however to be difficult to implement, especially for substrates of architectural size, having a dimension greater than one meter, in particular since heat transfer in a vacuum, which is necessarily radiative by nature, is difficult to control and is very costly in the case of large substrates measuring several meters in width. In the case of glass substrates of small thickness, there is often a high risk of breakage in this type of treatment.

Heating the coated substrate after deposition, for example by placing the substrate in a furnace or an oven or by subjecting the substrate to infrared radiation coming from conventional heaters, such as infrared lamps, also has drawbacks as these various processes contribute to heating the substrate and the thin film without distinction. Heating the substrate to temperatures above 150° C. is liable to cause breakages in the case of large substrates (those several meters in width) as it is impossible to ensure the same temperature over the entire width of the substrate. Heating the substrates also slows down the entire process, as it is necessary to wait while the substrates completely cool down before it can be envisaged cutting them or storing them, which generally takes place by stacking the substrates one on top of another. Very controlled cooling is also essential in order to prevent the generation of stresses within the glass, and therefore the possibility of breakages. Since such very controlled cooling is very expensive, the annealing treatment is generally not sufficiently controlled to remove the thermal stresses within the glass, thereby increasing the number of in-line breakages. The annealing treatment also has the drawback of making it more difficult to cut the glass, cracks having a lower tendency to propagate linearly.

Substrate heating does take place if the glazing is bent and/or tempered, since the glass is reheated to above its softening temperature (generally above 600° C., or even 700° C. for a few minutes). The tempering or bending treatment therefore allows the desired result, of crystallizing the thin films, to be obtained. However, it would be expensive for all glazings to be subjected to such treatments for the sole purpose of improving the crystallization of the films. Furthermore, the tempered glazing can no longer be cut, and certain thin-film multilayer coatings cannot withstand the high temperatures suffered during the tempering of the glass.

Patent application WO 2008/096089, filed by the applicant, describes a process of rapid annealing which consists in providing the film with an extremely high power per unit area. The film is heated extremely rapidly, without the heat having time to diffuse within the substrate. It is thus possible to thermally treat the thin film without significantly heating the substrate and while limiting the risk of breakage linked to the thermal shock. The flame treatment of the glass, using a device situated perpendicular to the run direction of the substrate, appears among the processes proposed. Application US 2008/8829 also describes a process for the flame treatment of coated glass.

It has however turned out that this technique could be problematic in the case of large size substrates, the width of which in a direction perpendicular to the run direction is greater than 1.1 m. Indeed, the inventors realized that the sheet of glass bent at a moment of passing under the flame treatment device, creating a bow which may be very large. This phenomenon is purely transient, in the sense that the final glass returns to its initial flat form at the moment of cooling. Without wishing to be tied to any one scientific theory, it would appear that the upper layer of the glass, which is hotter, expands more than the lower cold layer, the glass plate transiently curving in order to accommodate these differences in expansion. When the temperature gradient in the thickness of the glass decreases, the sheet glass returns to its initial shape. This bending, even transient, is capable of posing numerous problems during manufacture. The sheet of glass, which rises up, is made to approach, or even to touch, in places, the flame treatment device, which may lead to breakages, and in any case an inhomogeneous treatment, since the parts of the sheet which rise up the most (typically the central parts) experience higher temperatures. The product obtained, if it does not break, has treatment heterogeneities and therefore structure heterogeneities. Moreover, the bending is very problematic in the case where the substrate is supported by rollers and where the flame treatment device is situated below the substrate. In this case, the bent part of the substrate may dislodge the rollers, leading to breakages, or even the run being stopped. This transient bending phenomenon is particularly accentuated for large size substrates (having a width of more than 1.1 m, or even more than 2 m or more than 3 m). All other things being equal, a larger width is accompanied by a larger transient bending.

The objective of the invention is to propose a process of rapid treatment by flame treatment of thin films deposited on glass which does not have the aforementioned drawbacks.

For this purpose, one subject of the invention is a heat treatment process by flame treatment of at least one thin film deposited on a glass substrate running in the path of at least one flame treatment device comprising at least one burner, said treatment being able to increase the degree of crystallization of said at least one thin film and/or to increase the size of the crystallites in said at least one thin film, said process being characterized in that the position of the at least one burner is adjusted and/or at least one additional means is positioned so that the maximum transient bending "b" is less than 150 mm and respects the following condition:

$$b \leq 0.9 \times d$$

where the bending "b" corresponds to the distance, expressed in mm, between the plane of the substrate without heating and the point of the substrate closest to the plane passing through the tip of the burner and parallel to the plane of the substrate without heating, "d" corresponds to the distance between the plane of the substrate without heating and the tip of the burner, expressed in mm,
the width of the substrate "L" in a direction perpendicular to the run direction being greater than or equal to 1.1 m.

Preferably, the maximum transient bending "b" respects the following condition:

$$b \leq 500 \times \frac{L^2}{e^3}$$

where "e" corresponds to the thickness of the substrate, expressed in mm, the width "L" being expressed in meters.

The expression "tip of the burner" is understood to mean the end portion of the burner, through which the gases are exhausted from the burner. The burner may be an external combustion burner, in the sense that the mixing of the fuel and the oxidizer is carried out at the tip of the burner or in the continuation of the latter. In this case, the substrate is subjected to the action of a flame. The burner may also be an internal combustion burner, in the sense that the fuel and the oxidizer are mixed inside the burner: the substrate is then subjected to the action of hot gases. All intermediate cases are of course possible, in the sense that only part of the combustion may take place inside the burner, and the other part outside. Certain burners, in particular aeraulic burners, that is to say burners that use air as the oxidizer, have premixing chambers in which all or part of the combustion takes place. In this case, the substrate may be subjected to the action of a flame and/or of hot gases. Oxycombustion burners, that is to say burners that use pure oxygen, do not generally contain a premixing chamber. The hot gases may also be produced using a plasma torch: the heating is not carried out by a combustion reaction but by ionization between the electrodes of the torch.

The maximum transient bending is preferably less than or equal to 100 mm, or 80 mm and even 60 mm or 40 mm.

According to a first preferred embodiment, several linear flame treatment devices are used which are positioned so that the entire width of the substrate is treated, but not positioned in a same line, the length of each device not exceeding 1.2 m.

The expression "linear flame treatment device" is understood to mean a device that extends along a line, generally and preferably a straight line. The length of such a device is the distance, following said line, between the two end points of the device. This type of device makes it possible to subject an extended zone of the substrate to the heat treatment according to the invention. The expression "the linear devices are positioned in a same line" is understood to mean that the respective lines of each linear device coincide as one and the same line. On the contrary, according to the first preferred embodiment, the lines along which the linear devices extend do not form one and the same line.

The aforementioned application WO 2008/096089 describes the use of a flame treatment rig, therefore of a single linear device, positioned perpendicular to the run direction of the substrate, the length of which is at least equal to the width of the substrate.

The inventors have demonstrated that by subdividing the number of flame treatment devices so as to be able to use devices of reduced length while continuing to treat the entire surface of the substrate, it was possible to greatly reduce the bending.

In order to further minimize the transient bending, the length of the flame treatment devices is advantageously less than or equal to 1.0 m, or even 0.8 m or 0.5 m or else 0.3 m.

Preferably, the length of each flame treatment device is less than or equal to a third, or even a quarter and even a fifth of the width of the substrate.

The flame treatment devices may be positioned in various ways: parallel to one another or non-parallel, perpendicular to the run direction or making with the latter an angle other than 90°. As examples, they may be positioned in staggered rows or at angles. The flame treatment devices may also be positioned perpendicular to the run direction in a V-shape. The flame treatment devices number at least 2. Their number may be greater than or equal to 3, or 4, and even 5, or else 6, or 7, or even 8 depending on the width of the substrate.

For space requirement reasons, the flame treatment devices are preferably positioned in rows perpendicular to the run direction of the substrate. The number of rows is preferably at least 2, or even 3. Advantageously, the number of rows is not greater than 3 in order to limit the footprint of the flame treatment zone.

In order to reduce the bending as much as possible, the flame treatment devices or the rows are preferably spaced apart, along the run direction of the substrate, by a distance at least greater than 90% of the length of the flame treatment devices. This distance is advantageously greater than 1.5 times, especially 2 times and even 3 times the length of the flame treatment devices. In the direction perpendicular to the substrate, the flame treatment devices are preferably spaced apart by a distance at least equal to the length of the flame treatment devices, especially by at least 1.5 times, or 2 or even 3 times the length of the flame treatment devices.

In order to ensure that the substrate is affected by the treatment in its entirety, it is preferable to position the flame treatment devices so that there is an overlap, that is to say that certain zones (of small size, typically less than 10 cm) are treated at least twice.

According to a second preferred embodiment, at least one flame treatment device is positioned facing each of the faces of the substrate so that the points of contact of the flames with each face are spaced at most 30 cm apart.

Indeed, it is possible to greatly limit the bending, or even to eliminate it completely by placing a second flame treatment device opposite or almost opposite the first. The distance between the points of contact of the flames with each face may be zero (in which case the burners are located exactly opposite one another) or less than or equal to 30 cm, especially 20 cm and even 10 cm. In the case where this distance is very small, it is possible to orient the flame treatment devices so that the flames impact the substrate obliquely, that is to say not perpendicular to the plane of the substrate. This thus avoids too great a thermal radiation toward the burner located on the other side of the substrate.

Preferably, the relative distance of average velocity of the hot gases and/or the relative difference of temperature of the hot gases between the two flame treatment devices is less than or equal to 10%, especially 5%. This relative difference is even preferably zero.

According to a third embodiment, the substrate is cooled in a zone situated immediately after the flame treatment zone in the run direction of the substrate. The glass is thus cooled as soon as it leaves the flame treatment zone, which has the effect of very greatly reducing the bending. Various cooling devices can be used, the preferred devices being devices for blowing gas, especially air. The gas may be blown by nozzles in the direction of the substrate. The temperature of the gas is preferably ambient temperature and the blowing rate is suitable for obtaining rapid cooling. Air blowing rates between 50 and 150 m/s have proved to be suitable.

Whatever the embodiment of the invention, a run speed of the substrate between 2 and 15 m/min is preferably chosen. This speed must be adjusted as a function of the parameters of the burner, so as to be able to obtain the targeted temperatures at the film to be treated.

The distance "d" between the substrate and the tip of the burner is generally between 5 and 150 mm, especially between 5 and 50 mm. This distance must be adapted as a function of the burner technology employed, especially of the temperature of the gases exiting the burner, and of the temperature to be achieved at the substrate. It is preferable for the blue part of the flame, the center of the actual combustion reaction, to be in contact with the film to be treated, since this is the part of the flame where the temperature is the most stable, which is beneficial for the homogeneity of the treatment.

The temperature of the hot gases is preferably between 1300 and 2200° C., especially between 1300 and 1700° C. in the case of aeraulic burners. The velocity of the hot gases is preferably between 5 and 100 m/s.

Each of the embodiments described previously may of course be combined with one or more of the other embodiments. For example, the first embodiment may be combined with the second embodiment and/or the third embodiment. Likewise the second embodiment may be combined with the first embodiment and/or the third embodiment.

The flame treatment is preferably such that each point of said at least one thin film is brought to a temperature of at least 300° C. while maintaining a temperature less than or equal to 150° C. at any point of the face of said substrate opposite said first face, so as to increase the degree of crystallization of said thin film while keeping it continuous and without a step of melting said thin film.

The term "thin continuous film" is understood within the context of the present invention to mean that the film covers substantially the entire substrate or, in the case of a multilayer coating, the entire subjacent film. It is important that the continuous character of the thin film (and therefore its advantageous properties) be preserved by the treatment according to the invention.

The term "point of the film" is understood to mean an area of the film undergoing the treatment at a given instant. Preferably, the entire film (and therefore each point) is brought to a temperature of at least 300° C., but each point of the film is not necessarily treated simultaneously. The film may be treated at the same instant in its entirety, each point of the film being simultaneously brought to a temperature of at least 300° C. Alternatively, the film may be treated so that the various points of the film or sets of points are brought in succession to a temperature of at least 300° C., this second method being more often employed in the case of continuous implementation on an industrial scale.

The process according to the invention provides sufficient energy to promote the crystallization of the thin film, by a physico-chemical mechanism of crystalline growth around nuclei already present in the film, remaining in the solid phase. The process according to the invention does not involve a crystallization mechanism by cooling from a molten material, on the one hand as this would require bringing the thin film to extremely high temperatures in order to melt it and, on the other hand, as this would be liable to modify the thicknesses and/or the refractive indexes of the films, and therefore their properties. This would in particular modify their optical appearance, generating inhomogeneities detectable to the eye.

The process according to the invention has the advantage of heating only the thin film (or the thin films in the case of a multilayer coating) without significantly heating the entire substrate. Thus, it is not necessary to subject the substrate to controlled slow cooling before the glass is cut or stored. This process also makes it possible to integrate a heating device on existing continuous production lines, more particularly in the space located between the exit of the vacuum deposition chamber of the magnetron line and the device for storing the glass in stacks. It is also possible in certain cases to carry out the treatment according to the invention within the actual vacuum deposition chamber.

The flame treatment makes it possible to generate an extremely high power per unit area, something which cannot however be quantified absolutely, as it depends on many factors among which are the nature and the thickness of the thin film. This high power per unit area makes it possible to achieve the desired temperature in the film extremely rapidly (generally in a time less than or equal to 1 s) and consequently to limit the duration of the treatment correspondingly, the heat generated not therefore having the time to diffuse into the substrate. Each point of the thin film is subjected to the treatment according to the invention (i.e. brought to a temperature greater than or equal to 300° C.) for a duration generally less than or equal to 2 s, especially 1 s, or even 0.5 s. In order to do this, the run speed of the substrate during the treatment is advantageously at least 2 m/min.

To minimize the number of breakages in the case of the largest substrates (for example measuring 6 m in length by 3.2 m in width), a temperature less than or equal to 100° C., especially 50° C., is preferably maintained over the entire treatment at any point of the face of the substrate opposite the face on which the thin film is deposited.

Another advantage of the invention lies in the fact that the process subjects the thin film or thin-film multilayer coating to the equivalent of a tempering operation. It turns out that certain thin-film multilayer coatings have their optical properties (colorimetric coordinates, light transmission or energy transmission) modified when the glass is tempered. The process according to the invention therefore makes it possible to obtain an untempered glass (therefore one not having within it a stress profile specific to the tempered glass, which would make it cutable) but having substantially the same optical properties as if it had been tempered.

The degree of crystallization obtained using the process according to the invention is preferably greater than or equal to 20% or 50%, especially 70% and even 90%. This degree of crystallization, defined as the mass of crystallized material to the total mass of material, may be determined by X-ray diffraction using the Rietveld method. Owing to a crystallization mechanism by crystalline grain growth from nuclei or seeds, the increase in the degree of crystallization is generally accompanied by an increase in the size of the crystallized grains or of the coherent diffraction domains measured by X-ray diffraction.

The substrate is preferably made of soda-lime-silica glass. Other types of glass may be used, such as borosilicate, aluminosilicate or else alumino-borosilicate glass. The substrate may be transparent, translucent or opaque, colorless or colored (for example colored blue, gray, bronze, green, etc.).

The glass substrate advantageously has at least one dimension (especially the width L) greater than or equal to 2 m and even 3 m. The thickness "e" of the substrate generally varies between 0.5 mm and 19 mm. Preferably, the process according to the invention is carried out for glass substrates having a thickness between 2 and 6 mm, especially between 2 and 5 mm.

The thin film is preferably a film having at least one property improved when the degree of crystallization of said film increases. For the abovementioned reasons, and owing to the correlation between properties and degree of crystallization, the thin film is preferably based on a metal, an oxide, a nitride or a mixture of oxides chosen from silver, molybdenum, niobium, titanium oxide, indium zinc or indium tin mixed oxides, aluminum-doped or gallium-doped zinc oxide, titanium, aluminum or zirconium nitrides, niobium-doped titanium oxide, cadmium stannate and/or tin stannate, fluorine-doped and/or antimony-doped tin oxide. It even preferably consists of such a metal, oxide, nitride or mixture of oxides. The thickness of the thin film is preferably between 2 and 500 nm.

Most of the abovementioned thin films have the particular feature of being overall transparent to UV-visible radiation (the absorption being less than 50% in the visible range). Since their absorption spectrum is little different from that of the substrate (especially in the case in which the latter is made of glass), it is especially difficult to heat specifically the film, and not the substrate.

The thin film treated according to the invention may be the only thin film deposited on the substrate. It may also be included in a thin-film multilayer coating comprising thin films, generally chosen from oxides, nitrides or metals. The thin film may also itself be a thin-film multilayer coating. If the treated thin film is included in a thin-film multilayer coating, the process according to the invention may improve the crystallization properties of one or more thin films of the multilayer coating.

When the thin film is a silver or silver-based film, it is preferably included in a thin-film multilayer coating, especially so as to prevent it from oxidizing. In the case of solar-control or low-emissivity glazing, the silver-based thin film is generally placed between two oxide-based or nitride-based dielectric thin films.

It is also possible to place beneath the silver film a very thin film intended to promote the wetting and nucleation of the silver (for example a film of zinc oxide ZnO) and on the silver film a very thin second film (a sacrificial film, for example made of titanium) intended to protect the silver film if the subsequent film is deposited in an oxidizing atmosphere or in the case of heat treatments resulting in oxygen migration into the multilayer coating. The multilayer coatings may also comprise several silver films, each of these films generally being affected by the implementation of the process according to the invention. If the multilayer coating comprises a zinc oxide film, the treatment of the silver film is generally also accompanied by an increase in the degree of crystallization of the zinc oxide.

When the thin film is a transparent conductive film, for example one based on gallium-doped and/or aluminum-doped zinc oxide, it may be included in a multilayer coating comprising at least one underlayer forming a barrier to the migration of alkali metals and/or at least one overlayer acting as oxidation barrier. This type of multilayer coating is for example described in the application WO 2007/018951. However, the treatment according to the invention advantageously makes it possible to dispense with this type of underlayer or overlayer, since the rapidity of the heating causes very little migration of alkali metals or oxygen, compared with an annealing or tempering treatment. This is all the more advantageous if the conductive film has to serve as an electrode and must therefore be in direct electrical contact with other functional films (for example in the case of photovoltaic or OLED applications): in the case of a tempering or annealing treatment, the overlayer providing oxidation protection is necessary during the treatment and must then be removed. Thanks to the process according to the invention, it is possible to dispense with this overlayer.

The film based on titanium oxide is preferably a film made of titanium oxide (optionally doped). The entire surface of this film is preferably in contact with the outside so that the titanium oxide can fully fulfill its self-cleaning function. To further improve the crystallization of these films, it is possible to provide beneath the titanium-oxide-based film an underlayer having the effect of promoting the crystalline growth of the titanium oxide, especially in anatase form. This may especially be a $ZrO_2$ underlayer, as described in application WO 02/40417, or else an underlayer promoting the heteroepitaxial growth of the titanium oxide in anatase form, as described for example in application WO 2005/040058, especially a $BaTiO_3$ or $SrTiO_3$ film.

The thin film before treatment according to the invention may be obtained by any type of process, in particular processes that generate predominantly amorphous or nanocrystallized films, such as the magnetron sputtering process, the plasma-enhanced chemical vapor deposition (PECVD) process, the vacuum evaporation process or the sol-gel process. However, it is preferably a "dry" film, containing no aqueous or organic solvent, as opposed to a "wet" film obtained for example by the sol-gel process. It is very preferably obtained by sputtering, especially magnetically-enhanced sputtering (magnetron sputtering process). In the case of a film obtained by the sol-gel process, precursors in solution (sol) are deposited on the substrate, the film obtained then being dried and annealed so as to remove any trace of solvent. In this case, the energy provided by the heating then serves predominantly to remove this solvent, without necessarily affecting the crystallization properties of the film, and it is consequently more difficult to improve said properties in a time short enough not to also heat the substrate.

The gas used for the flame treatment may be a mixture of an oxidant gas, chosen especially from air, oxygen or mixtures thereof, and a combustible gas, chosen in particular from natural gas, propane, butane, or even acetylene or hydrogen, or mixtures thereof. Oxygen is preferred as oxidant gas, in particular in combination with natural gas (methane) or propane, on the one hand because it enables higher temperatures to be achieved, consequently shortening the treatment and preventing the substrate from being heated, and, on the other hand, because it prevents the creation of nitrogen oxides $NO_x$. To achieve the desired temperatures at the thin film, the coated substrate is generally positioned within the visible flame, especially in the hottest region of the flame, a portion of the visible flame then extending around the treated region.

Flame treatment is a technique widely employed for treating the surface of polymers so as to improve their wettability properties and to make it easier for them to be coated with paints. In the use to which flame treatment is put, the principle is to subject the surface to be treated to the action of radicals created by the combustion, without bringing said surface to a high temperature. Application US 2006/128563 describes the use of this technique for activating surfaces of titanium oxide films so as to improve their hydrophilicity properties. The treatments described, which are quite similar to those carried out on polymer substrates, consist in making a substrate run through or slightly below (a few centimeters below) the tip of the visible flame. This type of treatment, which aims to create hydroxyl groups on the surface of the titanium oxide, is however not suitable for increasing the degree of crystallization of the titanium oxide, since the temperatures in the tip of the visible flame are insufficient.

When the thin film is based on titanium oxide (or consists of titanium oxide), one preferred embodiment of the invention consists in bringing said thin film to a temperature of between 300 and 800° C., preferably between 400 and 600° C., so that said thin film comprises titanium oxide in anatase form. As indicated above, such crystallization enables the photocatalytic activity of titanium oxide to be considerably increased.

The process according to the invention is particularly advantageous in the case of titanium oxide, since when a substrate containing alkali metal ions (for example a glass of the soda-lime-silica type) is brought to a high temperature, said ions have a tendency to diffuse into the titanium oxide film, thereby very considerably reducing, or even eliminating, its photocatalytic properties. For this reason, it is common practice to interpose a barrier layer between the thin titanium oxide film and the substrate so as to prevent migration of alkali metals, as taught in application EP-A-0 850 204, or to increase the thickness of the titanium oxide film so that at least the outermost surface of the film is not contaminated, as taught in application EP-A-0 966 409. In the case of the process according to the invention, the substrate is practically not heated and consequently the migration of alkali metals is virtually zero. The process according to the invention therefore makes it possible to obtain substrates made of soda-lime-silica glass coated directly with a thin titanium oxide film (for example with a thickness of the order of 10 nm) which nevertheless have a very high photocatalytic activity.

When the thin film is based on silver (or consists of silver), said thin film is preferably raised to a temperature of between 300 and 600° C., preferably between 350 and 550° C.

Another subject of the invention is a process for obtaining a material comprising a substrate and at least one thin film, in which said at least one thin film is deposited on said substrate then said at least one thin film is subjected to the heat treatment process according to the invention. Preferably, the at least one thin film is deposited by sputtering, especially magnetically enhanced (magnetron) sputtering. All the details given previously regarding the nature of the thin film and of the multilayer coatings in which it may be are obviously also applicable to this process.

The substrates obtained according to the invention may be used in single, multiple or laminated glazing, in mirrors or in glass wall coverings. In the case of multiple glazing comprising at least two glass sheets separated by a gas layer, it is preferable for the thin film to be positioned on the face in contact with said gas layer.

The substrates obtained according to the invention may also be used in photovoltaic glazing or cells or in solar panels, the thin film treated according to the invention being for example an electrode based on ZnO:Al or ZnO:Ga in multilayer coatings based on chalcopyrites (especially of CIS type, i.e. CuInSe$_2$) or based on amorphous and/or polycrystalline silicon, or else based on CdTe.

In the photovoltaic glazing or cell, the substrate according to the invention is preferably the faceplate substrate. It is generally oriented so that the transparent electrode coating is located beneath a main surface turned toward the photovoltaic material. This electrode coating is in electrical contact with the photovoltaic material placed beneath when the main direction of arrival of the incident radiation is considered to be via the top.

This faceplate electrode coating thus constitutes in general the negative (or hole-collecting) terminal of the solar cell. Of course, the solar cell also has on the backplate substrate an electrode coating that then constitutes the positive (or electron-collecting) terminal of the solar cell, but in general the electrode coating of the backplate substrate is not transparent.

The substrates obtained according to the invention may also be used in display screens of the LCD (liquid crystal display), OLED (organic light-emitting diode) or FED (field emission display) type, the thin film treated according to the invention being for example an electroconductive film of ITO. They may also be used in electrochromic glazing, the thin film treated according to the invention being for example an upper transparent electroconductive film, as taught in application FR-A-2 833 107.

The invention is illustrated by the following figures and nonlimiting embodiment examples.

FIG. 1 is a schematic cross-sectional view illustrating the transient bending phenomenon.

FIGS. 2-1 to 2-3 and 3-1 to 3-4 illustrate, as top views, various embodiments of the invention. FIG. 2-4 illustrates a comparative embodiment, outside of the invention.

FIG. 4 is a vertical cross-sectional view of another embodiment of the invention.

Figures 1, 2, 3, 4:
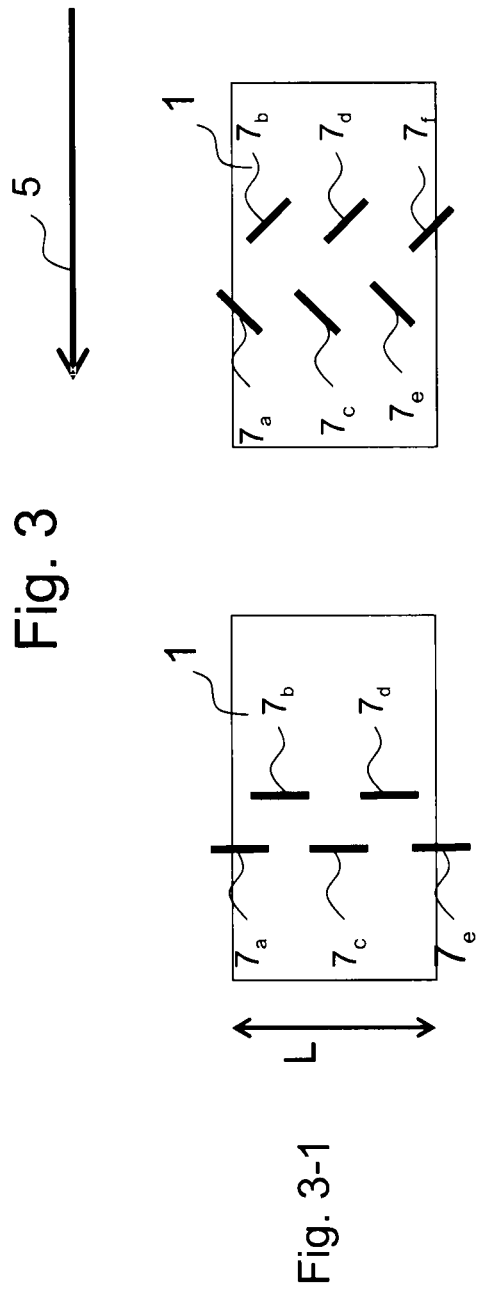

In FIG. 1, the substrate 1, of thickness e, is running in the direction 5 under a flame treatment device comprising a burner 2. The heat released by the flame 4 has the effect of crystallizing the thin film (not represented) present on the substrate. This heat also creates a transient bending b. The distance b corresponds to the distance between the plane of the substrate without heating P$_1$ and the point 3 of the substrate which is closest to the plane P$_2$ passing through the tip 6 of the burner 2 and parallel to the plane of the substrate without heating P$_1$. The distance d corresponds to the distance between the plane of the substrate without heating P$_1$ and the tip 6 of the burner 2. The maximum bending is not generally in the axis of the burner 2, but slightly offset.

In FIGS. 2-1 to 2-4 and 3-1 to 3-4, the substrate 1 of width L and running in the direction 5 is represented as a top view. Several linear flame treatment devices 7 are positioned facing the substrate 1 so that the entire width L of the substrate 1 is treated.

These devices are linear since they each extend along a line, represented by dotted lines in FIGS. 2-1, 2-3 and 2-4. The length 1 of a device is indicated in FIG. 2-1.

The linear devices are not however positioned in a same line, contrary to what is described in FIG. 2-4, which illustrates an embodiment outside of the invention. In the latter case, the linear devices are positioned in a same line, since each line in the direction in which each device extends coincides to form one and the same line. This comparative embodiment does not make it possible to prevent the appearance of significant bending, since it is equivalent to a mode that uses only a single linear device that extends over the entire width of the substrate. In the other figures, which illustrate embodiments of the invention, the various lines, in the direction in which the linear devices extend, are clearly distinct and do not form one and the same line.

The length of each device does not exceed 1.2 m. In the figures, the devices are 5, 6 or 9 in number, but any other number greater than or equal to 2 is possible. The figures illustrate various possible configurations of flame treatment devices: the devices 7 may be positioned in rows, perpendicular to the run direction 5 of the substrate 1 (FIGS. 2-1, 2-2, 3-1 and 3-3) or obliquely (FIGS. 2-3, 3-2, 3-4). The number of rows may be 2 or 3, but any other number is possible.

Figure 5:
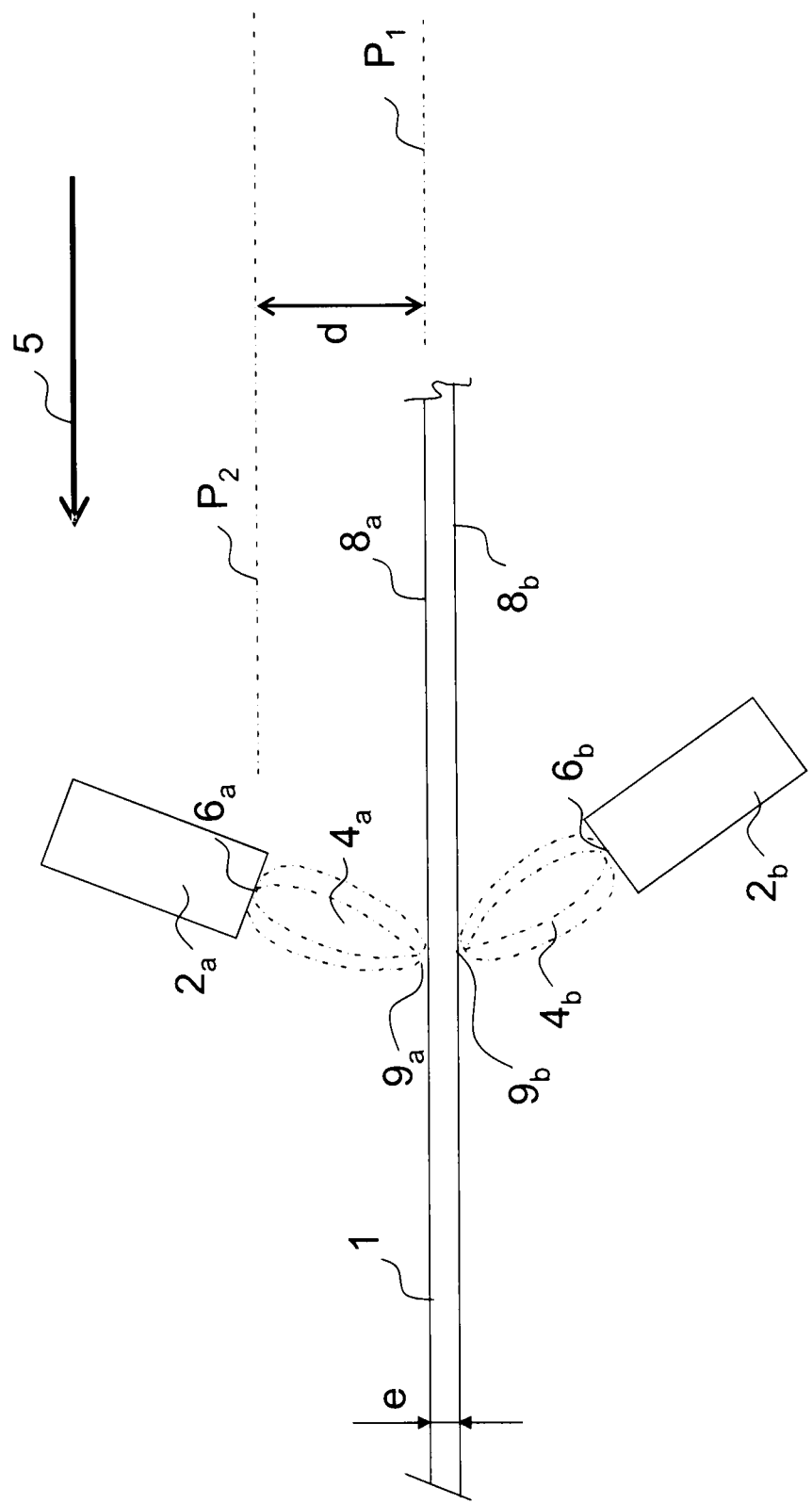
FIG. 5 is a vertical cross-sectional view of another embodiment of the invention.

In the embodiment of FIGS. 4 and 5, a flame treatment device comprising a burner 2$_a$ or 2$_b$ is positioned facing each of the faces 8$_a$ and 8$_b$ respectively of the substrate 1. The points of contact 9$_a$ and 9$_b$ of the flames 4$_a$ and 4$_b$ with each face 8$_a$ and 8$_b$ are spaced at most 30 cm apart in the run direction 5. In the embodiment represented in FIG. 4, the burners 2$_a$ and 2$_b$ are positioned obliquely relative to a direction perpendicular to the substrate 1. In this way, the distance between the points of contact 9$_a$ and 9$_b$ may be zero or almost zero without the radiation due to the flames 4 damaging the burners 2 positioned facing the opposite face.

Figure 6:
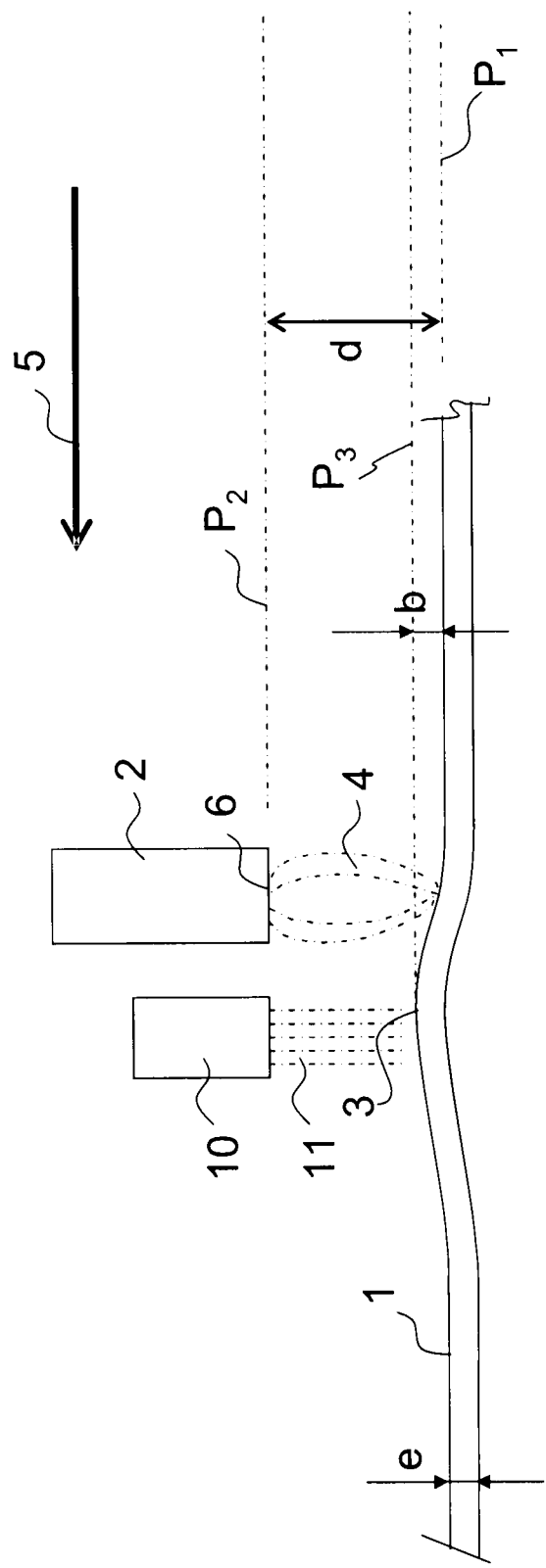
FIG. 6 is a vertical cross-sectional view of another embodiment of the invention.

In the embodiment of FIG. 6, the substrate 1 is cooled in a zone located immediately after the flame treatment zone in the run direction 5 of the substrate 1. In order to do this, a cooling device 10 is positioned after the flame treatment device comprising the burner 2. The cooling device 10 is here a device for blowing fresh air. The air is blown in the direction of the substrate (represented by the dotted lines 11). This blowing has the effect of considerably reducing the bending b.

EXAMPLE 1 (COMPARATIVE)

A soda-lime-silica glass substrate obtained by the float process and then cut so that its size was 3.2 m in width by 6 m in length with a thickness of 4 mm was coated in a known manner by the magnetron sputtering process with a thin titanium oxide film 15 nm in thickness. A 25 nm thick silica film was interposed between the substrate and the titanium oxide film.

The substrate thus coated was made to run facing a linear flame treatment device extending over the entire width of the substrate. The device was essentially constituted of a linear burner using natural gas as fuel and oxygen as oxidizer. The distance between the tip of the burner and the plane of the substrate without treatment was around 50 mm, so that the blue part of the flame was in contact with the titanium oxide film. The film to be treated was thus placed in the hottest zone of the flame. The run speed was around 5 m/min. Significant bending was observed during the flame treatment, at the point that the substrate touched the tip of the burner, leading to breakages.

The photocatalytic activity of the layer before treatment and following treatment was assessed by the measurement of the rate of degradation of methylene blue in the presence of ultraviolet radiation. An aqueous solution of methylene blue was placed in contact with the coated substrate in a sealed cell (the substrate forming the bottom of the cell). After exposure to ultraviolet radiation for 30 minutes, the concentration of methylene blue was assessed by means of a light transmission measurement. The photocatalytic activity value (denoted by Kb and expressed in g·l$^{-1}$·min$^{-1}$) corresponds to the reduction in methylene blue concentration per unit exposure time.

The photocatalytic activity before flame treatment was less than 7 g·l$^{-1}$·min$^{-1}$. After treatment, it appeared that the photocatalytic activity was greatly increased (of the order of 20 on average) but was not homogeneous throughout the sample. Certain zones had a photocatalytic activity of the order of 30, whilst others had an activity of the order of 10.

EXAMPLE 2

This example is identical to Example 1, the only difference being that the single linear flame treatment device was replaced by 5 linear devices of 50 cm in length, positioned perpendicular to the run direction in 2 rows as represented in FIG. 3-1.

The transient bending was very substantially reduced by the order of 30 mm, completely eliminating the risk of breakage. Moreover, the photocatalytic activity was of the order of 30±2 g·l$^{-1}$·min$^{-1}$ over the entire surface of the substrate. The homogeneity of the treatment was thus greatly improved.

EXAMPLE 3

A soda-lime-silica glass substrate obtained by the float process and then cut so that its size was 3.2 m in width by 6 m in length with a thickness of 4 mm was coated in a known manner by the magnetron sputtering process with a thin-film multilayer coating that included a silver film, said silver film giving the glass low-emissivity properties.

This multilayer coating comprised, in the following order (from the substrate to the outer surface), the following oxide, metallic or nitride films, the geometric thicknesses being indicated in brackets:
Glass/SnO$_2$ (18 nm)/ZnO (16 nm)/Ag (8.5 nm)/Ni—Cr/ZnO (14 nm)/Si$_3$N$_4$ (23 nm).

The flame treatment was carried out using 6 flame treatment devices of 80 cm in length positioned as indicated in FIG. 3-2.

The run speed of the substrate was 7 m/min, and the burners were fed with air and butane. The distance between the substrate and the tip of the burner was 40 mm.

The transient bending was very small, of the order of 30 mm. No breakage was observed.

Table 1 below indicates the change in the following properties after treatment:
- the light transmission under illuminant D$_{65}$, calculated from an experimental spectrum, taking the standard illuminant D$_{65}$ as reference and the "CIE 1964" reference observer, for a double glazing unit having glass sheets 4 mm in thickness and the gas layer (a mixture of 90% argon and 10% air) having a thickness of 16 mm, the transmission being denoted by T$_L$ and expressed in percent;
- the sheet resistance, denoted by R$_c$ and expressed in ohms; and
- the normal emissivity at a temperature of 283 K calculated according to the EN 12898 standard from a reflection spectrum in the 5-50 micron spectral range, denoted by $\epsilon_n$ and expressed in percent.

The latter two properties (sheet resistance and emissivity), which illustrate the electrical conductivity and low-emissivity performance of the film, reflect the degree of crystallization and the size of the crystals of the silver film, since better crystallized silver films have both a higher electrical conductivity and better emissivity properties.

TABLE 1

| T$_L$ (%) | | R$_c$ (Ω) | | $\epsilon_n$ (%) | |
|---|---|---|---|---|---|
| before | after | before | after | before | after |
| 76.8 | 78.2 | 5.1 | 4.5 | 5.6 | 5.0 |

The changes due to the treatment in terms of sheet resistance and normal emissivity are around 10%. These results show that the treatment of the silver film had the consequence of improving the crystallization of the silver film, characterized in particular by a higher degree of crystallization and a larger crystal size. It may also be noted that there is a significant increase in the light transmission of the glazing obtained.

Finally, the treatment carried out was remarkable in that these properties (sheet resistance, normal emissivity and light transmission) were very homogeneous over the entire surface of the substrate: they did not vary by more than ±0.5% in T$_L$ and by more than 3% in relative terms for the sheet resistance R$_c$.

EXAMPLE 4 (COMPARATIVE)

The comparative Example 4 differed from Example 3 in that a single flame treatment device was used, the width of which was greater than or equal to the width of the substrate.

In this case, the transient bending was such that the substrate broke on touching the tip of the burner. The light transmission, normal emissivity and sheet resistance properties were substantially improved by the heat treatment, but were not homogeneous over the entire surface of the glass.

EXAMPLE 5

In this example, a coated substrate identical to that of Example 1, therefore coated with a multilayer coating that included a titanium oxide film, was used.

Two flame treatment devices, the length of which was of the order of the width of the substrate, were positioned on either side of the substrate, and oriented as represented in FIG. 5, so that the points of contact of the flames with each face were spaced apart by a zero distance in the run direction. The velocity of the gases and their temperature was identical for each of the flame treatment devices, so that each face was subjected to an identical treatment. In this way, the bending was almost zero, as represented schematically in FIG. 5.

The photocatalytic activity obtained, which demonstrates a crystallization in anatase form, was particularly homogeneous over the entire surface of the substrate.

EXAMPLE 6

A transparent conductive film based on aluminum-doped zinc oxide 700 nm in thickness was deposited on a glass substrate by a magnetron sputtering process. The substrate had a width of 2.2 m and a thickness of 2.9 mm.

The treatment used a linear flame treatment device positioned perpendicular to the run direction of the substrate. The run speed was 8 m/min and the device was fed with natural gas and oxygen. Immediately after the flame treatment device, a nozzle for blowing air at ambient temperature was positioned.

The transient bending obtained was less than 35 mm when blowing was carried out. On the other hand, it was greater than 130 mm in the absence of blowing.

Table 2 below indicates the sheet resistance and light transmission values before and after treatment.

TABLE 2

| Transmission (%) | | R$_c$(Ω) | |
|---|---|---|---|
| before | after | before | after |
| 70.0 | 81.5 | 19 | 9 |

These values were particularly homogeneous when air blowing was used.

EXAMPLE 7

A soda-lime-silica glass substrate obtained by the float process and then cut so that its size was 3.2 m in width by 6 m in length with a thickness of 4 mm was coated on its first face with a thin titanium oxide film 15 nm in thickness. A 25 nm thick silica film was interposed between the substrate and the titanium oxide film.

The substrate was also coated, on its second face, with a thin-film multilayer coating that included a silver film, said silver film giving the glass low-emissivity properties.

This multilayer coating comprised, in the following order (from the substrate to the outer surface), the following oxide, metallic or nitride films, the geometric thicknesses being indicated in brackets:

Glass/SnO$_2$ (18 nm)/ZnO (16 nm)/Ag (8.5 nm)/Ni—Cr/ZnO (14 nm)/Si$_3$N$_4$ (23 nm). All the depositions were carried out by the magnetron sputtering process.

Two flame treatment devices, the length of which was of the order of the width of the substrate, were positioned on either side of the substrate, as represented in FIG. 4, so that the points of contact of the flames with each face were spaced apart by a small distance in the run direction. The velocity of the gases and their temperature was identical for each of the flame treatment devices, so that each face was subjected to an identical treatment. In this way, the bending was very small, as represented schematically in FIG. 4.

In this way, a substrate coated on one face with a self-cleaning film based on titanium oxide crystallized in anatase form and on the other face with a low-emissivity multilayer coating was obtained in one step.

The invention claimed is:

1. A process of heat treatment by flame treatment of at least one thin film deposited on a glass substrate, the process comprising:

running a glass substrate comprising at least one thin film deposited thereon in a path of a plurality of linear flame treatment devices, wherein each flame treatment device comprises at least one combustion burner and the length of each flame treatment device is less than or equal to a third of the width of the glass substrate, wherein the heat treatment increases at least one selected from the group consisting of a degree of crystallization of the at least one thin film and a size of crystallites in the at least one thin film, and wherein a position of the combustion burner is adjusted so that a maximum transient bending "b" is less than 150 mm and satisfies an equation:

$$b \leq 0.9 \times d,$$

wherein:

the maximum transient bending, "b", is a distance, expressed in mm, between a first plane of the substrate without heating, P$_1$, and a point of the substrate closest to a second plane, P$_2$, passing through a tip of the combustion burner and parallel to the first plane;

"d" is a distance between the first plane and the tip of the combustion burner, expressed in mm; and a width of the substrate, "L", in a direction perpendicular to a direction of the running is greater than or equal to 1.1 m.

2. The process of claim 1, wherein the maximum transient bending "b" satisfies equation:

$$b \leq 500 \times \frac{L^2}{e^3},$$

wherein "e" is the thickness of the substrate, expressed in mm, and "L" is the width of the substrate expressed in meters.

3. The process of claim 1, wherein the linear flame treatment devices are positioned such that an entire width of the substrate is treated, but not positioned in a same line, and wherein a length of each device does not exceed 1.2 m.

4. The process of claim 1, wherein at least one flame treatment device is positioned facing each of a first and a second face of the substrate so that a first and a second point of contact of flames from the device with each face are spaced at most 30 cm apart.

5. The process of claim 1, further comprising:

cooling the substrate in a zone situated immediately after the flame treatment zone in a direction of the running of the substrate.

6. The process of claim 1, wherein each point of the at least one thin film is brought to a temperature of at least 300° C. while maintaining a temperature less than or equal to 150° C. at any point of a face of opposite substrate opposite a first face.

7. The process of claim 1, wherein the substrate comprises soda-lime-silica glass.

8. The process of claim 1, wherein a temperature less than or equal to 100° C. is maintained at any point of a face of the substrate opposite a face on which the at least one thin film is deposited.

9. The process of claim 1, wherein each point of the thin film is brought to a temperature greater than or equal to 300° C. for a duration less than or equal to 1 s.

10. The process of claim 1, wherein the degree of crystallization obtained is greater than or equal to 20%.

11. The process claim 1, wherein the width, "L", of the substrate is greater than or equal to 2 m.

12. The process claim 1, wherein the at least one thin film comprises a metal, an oxide, a nitride, or a mixture of oxides selected from the group consisting of silver, molybdenum, niobium, titanium oxide, indium zinc or indium tin mixed oxides, aluminum-doped zinc oxide, gallium-doped zinc oxide, titanium, aluminum nitride, zirconium nitride, niobium-doped titanium oxide, cadmium stannate, zinc stannate, fluorine-doped tin oxide, and antimony-doped tin oxide.

13. The process of claim 1, further comprising, prior to the running:

depositing at least one thin film on the substrate.

14. The process of claim 13, wherein the at least one thin film is deposited by sputtering.

15. The process of claim 1, wherein a temperature less than or equal to 50° C. is maintained at any point of a face of the substrate opposite a face on which the at least one thin film is deposited.

16. The process of claim 1, wherein each point of the thin film is brought to a temperature greater than or equal to 300° C. for a duration less than or equal to 0.5 s.

17. The process of claim 1, wherein the degree of crystallization obtained is greater than or equal to 50%.

18. The process of claim 13, wherein the at least one thin film is deposited by magnetically enhanced sputtering.

19. The process of claim 2, wherein the linear flame treatment devices are positioned such that an entire width of the substrate is treated, but not positioned in a same line, and wherein a length of each device does not exceed 1.2 m.

20. A process of heat treatment by flame treatment of at least one thin film deposited on a glass substrate, the process comprising:

running a glass substrate comprising at least one thin film deposited thereon in a path of a plurality of linear flame treatment devices, which are not plasma torches, wherein each flame treatment device comprises at least one burner and the length of each flame treatment device is less than or equal to a third of the width of the glass substrate, wherein the heat treatment increases at least one selected from the group consisting of a degree of crystallization of the at least one thin film and a size of crystallites in the at least one thin film, and wherein a position of the at least one burner, a position of an additional burner, or a position of the at least one burner and the additional burner is adjusted so that a maximum transient bending "b" is less than 150 mm and satisfies an equation:

$$b \leq 0.9 \times d,$$

wherein:

the maximum transient bending, "b", is a distance, expressed in mm, between a first plane of the substrate without heating, $P_1$, and a point of the substrate closest to a second plane, $P_2$, passing through a tip of the burner and parallel to the first plane;

"d" is a distance between the first plane and the tip of the burner, expressed in mm; and a width of the substrate, "L", in a direction perpendicular to a direction of the running is greater than or equal to 1.1 m.

* * * * *